United States Patent
Tsai et al.

(10) Patent No.: US 10,008,459 B2
(45) Date of Patent: Jun. 26, 2018

(54) STRUCTURES HAVING A TAPERING CURVED PROFILE AND METHODS OF MAKING SAME

(71) Applicant: Taiwan Semiconductor Manufacturing Company, Ltd., Hsin-Chu (TW)

(72) Inventors: Pei-Chun Tsai, Zhongli (TW); Yu-Jen Tseng, Hsin-Chu (TW); Tin-Hao Kuo, Hsin-Chu (TW); Chen-Shien Chen, Zhubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 76 days.

(21) Appl. No.: 13/734,811

(22) Filed: Jan. 4, 2013

(65) Prior Publication Data

US 2014/0077359 A1 Mar. 20, 2014

Related U.S. Application Data

(60) Provisional application No. 61/702,624, filed on Sep. 18, 2012, provisional application No. 61/707,644, (Continued)

(51) Int. Cl.
*H01L 21/44* (2006.01)
*H01L 23/00* (2006.01)
(Continued)

(52) U.S. Cl.
CPC ........ *H01L 24/02* (2013.01); *H01L 21/76885* (2013.01); *H01L 24/11* (2013.01);
(Continued)

(58) Field of Classification Search
CPC . H01L 2924/01013; H01L 2924/01029; H01L 2924/01079; H01L 2924/00014;
(Continued)

(56) References Cited

U.S. PATENT DOCUMENTS 4,258,382 A 3/1981 Harris
4,536,421 A 8/1985 Matsuzawa et al.
(Continued)

FOREIGN PATENT DOCUMENTS

CN 101080138 A 11/2007
CN 101188219 A 5/2008
(Continued)

OTHER PUBLICATIONS

Garrou, Phil, "IFTLE 58 Fine Pitch Microjoints, Cu Pillar Bump-on-Lead, Xilinx Interposer Reliability," Solid State Technology, Insights for Electronic Manufacturing, Jul. 18, 2011, 3 pages.

*Primary Examiner* — David Chen
(74) *Attorney, Agent, or Firm* — Slater Matsil, LLP

(57) ABSTRACT

An embodiment ladder bump structure includes an under bump metallurgy (UBM) feature supported by a substrate, a copper pillar mounted on the UBM feature, the copper pillar having a tapering curved profile, which has a larger bottom critical dimension (CD) than a top critical dimension (CD) in an embodiment, a metal cap mounted on the copper pillar, and a solder feature mounted on the metal cap.

20 Claims, 5 Drawing Sheets

Related U.S. Application Data filed on Sep. 28, 2012, provisional application No. 61/707,609, filed on Sep. 28, 2012, provisional application No. 61/707,442, filed on Sep. 28, 2012.

(51) Int. Cl.
*H01L 21/768* (2006.01)
*H01L 21/48* (2006.01)
*H01L 23/498* (2006.01)

(52) U.S. Cl.
CPC .............. *H01L 24/13* (2013.01); *H01L 24/16* (2013.01); *H01L 24/81* (2013.01); *H01L 21/4853* (2013.01); *H01L 23/49811* (2013.01); *H01L 24/14* (2013.01); *H01L 2224/0215* (2013.01); *H01L 2224/02125* (2013.01); *H01L 2224/02141* (2013.01); *H01L 2224/02145* (2013.01); *H01L 2224/0401* (2013.01); *H01L 2224/10125* (2013.01); *H01L 2224/1112* (2013.01); *H01L 2224/11013* (2013.01); *H01L 2224/11019* (2013.01); *H01L 2224/11462* (2013.01); *H01L 2224/11472* (2013.01); *H01L 2224/136* (2013.01); *H01L 2224/13015* (2013.01); *H01L 2224/13017* (2013.01); *H01L 2224/13023* (2013.01); *H01L 2224/1357* (2013.01); *H01L 2224/1369* (2013.01); *H01L 2224/13082* (2013.01); *H01L 2224/13083* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13551* (2013.01); *H01L 2224/13564* (2013.01); *H01L 2224/13565* (2013.01); *H01L 2224/13582* (2013.01); *H01L 2224/13686* (2013.01); *H01L 2224/14051* (2013.01); *H01L 2224/16227* (2013.01); *H01L 2224/16238* (2013.01); *H01L 2224/16503* (2013.01); *H01L 2224/81007* (2013.01); *H01L 2224/8181* (2013.01); *H01L 2224/8192* (2013.01); *H01L 2224/81191* (2013.01); *H01L 2224/81424* (2013.01); *H01L 2224/81439* (2013.01); *H01L 2224/81444* (2013.01); *H01L 2224/81447* (2013.01); *H01L 2924/07025* (2013.01); *H01L 2924/181* (2013.01); *H01L 2924/301* (2013.01); *H01L 2924/35* (2013.01); *Y10T 29/49144* (2015.01)

(58) Field of Classification Search
CPC ..... H01L 2224/03912; H01L 2224/119; H01L 2224/11914; H01L 2224/0401; H01L 2224/03914; H01L 2224/11526; H01L 2224/13006; H01L 2224/13007
USPC ......... 257/737–739, 774, E21.508, E23.021, 257/E23.022, 778–781; 438/108, 438/612–614
See application file for complete search history.

(56) References Cited

U.S. PATENT DOCUMENTS

| | | |
|---|---|---|
| 4,811,082 A | 3/1989 | Jacobs et al. |
| 4,830,723 A | 5/1989 | Galvagni et al. |
| 4,990,462 A | 2/1991 | Sliwa, Jr. |
| 5,075,253 A | 12/1991 | Sliwa, Jr. |
| 5,075,965 A | 12/1991 | Carey et al. |
| 5,130,779 A | 7/1992 | Agarwala et al. |
| 5,134,460 A | 7/1992 | Brady et al. |
| 5,277,756 A | 1/1994 | Dion |
| 5,334,804 A | 8/1994 | Love et al. |
| 5,380,681 A | 1/1995 | Hsu |
| 5,431,328 A | 7/1995 | Chang et al. |
| 5,440,239 A | 8/1995 | Zappella et al. |
| 5,470,787 A | 11/1995 | Greer |
| 5,481,133 A | 1/1996 | Hsu |
| 5,492,266 A | 2/1996 | Hoebener et al. |
| 5,542,601 A | 8/1996 | Fallon et al. |
| 5,565,379 A | 10/1996 | Baba |
| 5,587,337 A | 12/1996 | Idaka et al. |
| 5,680,187 A | 10/1997 | Nagayama et al. |
| 5,743,006 A | 4/1998 | Beratan |
| 5,790,377 A | 8/1998 | Schreiber et al. |
| 5,796,591 A * | 8/1998 | Dalal et al. .................. 361/779 |
| 5,816,478 A | 10/1998 | Kaskoun et al. |
| 5,889,326 A | 3/1999 | Tanaka |
| 5,922,496 A | 7/1999 | Dalal et al. |
| 5,977,599 A | 11/1999 | Adrian |
| 6,002,172 A | 12/1999 | Desai et al. |
| 6,002,177 A | 12/1999 | Gaynes et al. |
| 6,025,650 A | 2/2000 | Tsuji et al. |
| 6,051,273 A | 4/2000 | Dalal et al. |
| 6,082,610 A | 7/2000 | Shangguan et al. |
| 6,091,141 A | 7/2000 | Heo |
| 6,099,935 A | 8/2000 | Brearley et al. |
| 6,130,476 A | 10/2000 | LaFontaine, Jr. et al. |
| 6,137,184 A | 10/2000 | Ikegami |
| 6,181,010 B1 | 1/2001 | Nozawa |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,249,051 B1 | 6/2001 | Chang et al. |
| 6,250,541 B1 | 6/2001 | Shangguan et al. |
| 6,259,159 B1 | 7/2001 | Dalal et al. |
| 6,271,059 B1 | 8/2001 | Bertin et al. |
| 6,279,815 B1 | 8/2001 | Correia et al. |
| 6,291,891 B1 | 9/2001 | Higashi et al. |
| 6,336,262 B1 | 1/2002 | Dalal et al. |
| 6,344,234 B1 | 2/2002 | Dalal et al. |
| 6,346,469 B1 * | 2/2002 | Greer ........................ 438/614 |
| 6,355,501 B1 | 3/2002 | Fung et al. |
| 6,358,847 B1 | 3/2002 | Li et al. |
| 6,388,322 B1 | 5/2002 | Goossen et al. |
| 6,424,037 B1 | 7/2002 | Ho et al. |
| 6,426,556 B1 | 7/2002 | Lin |
| 6,434,016 B2 | 8/2002 | Zeng et al. |
| 6,448,661 B1 | 9/2002 | Kim et al. |
| 6,461,895 B1 | 10/2002 | Liang et al. |
| 6,469,394 B1 | 10/2002 | Wong et al. |
| 6,475,897 B1 | 11/2002 | Hosaka |
| 6,476,503 B1 | 11/2002 | Imamura et al. |
| 6,492,197 B1 | 12/2002 | Rinne |
| 6,498,308 B2 | 12/2002 | Sakamoto |
| 6,562,653 B1 | 5/2003 | Ma et al. |
| 6,562,657 B1 | 5/2003 | Lin |
| 6,570,248 B1 | 5/2003 | Ahn et al. |
| 6,573,598 B2 * | 6/2003 | Ohuchi et al. ................ 257/734 |
| 6,578,754 B1 | 6/2003 | Tung |
| 6,583,846 B1 | 6/2003 | Yanagawa et al. |
| 6,592,019 B2 | 7/2003 | Tung |
| 6,600,222 B1 | 7/2003 | Levardo |
| 6,607,938 B2 | 8/2003 | Kwon et al. |
| 6,661,085 B2 | 12/2003 | Kellar et al. |
| 6,713,844 B2 | 3/2004 | Tatsuta et al. |
| 6,731,003 B2 | 5/2004 | Joshi et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,940,169 B2 | 9/2005 | Jin et al. |
| 6,940,178 B2 | 9/2005 | Kweon et al. |
| 6,943,067 B2 | 9/2005 | Greenlaw |
| 6,946,384 B2 | 9/2005 | Kloster et al. |
| 6,972,490 B2 | 12/2005 | Chang et al. |
| 6,975,016 B2 | 12/2005 | Kellar et al. |

(56) References Cited

U.S. PATENT DOCUMENTS

| | | | |
|---|---|---|---|
| 6,998,216 B2 | 2/2006 | He et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,135,766 B1 | 11/2006 | Costa et al. | |
| 7,151,009 B2 | 12/2006 | Kim et al. | |
| 7,157,787 B2 | 1/2007 | Kim et al. | |
| 7,192,803 B1 | 3/2007 | Lin et al. | |
| 7,215,033 B2 | 5/2007 | Lee et al. | |
| 7,245,023 B1 | 7/2007 | Lin | |
| 7,251,484 B2 | 7/2007 | Aslanian | |
| 7,271,483 B2 | 9/2007 | Lin et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,382,049 B2 | 6/2008 | Ho et al. | |
| 7,402,442 B2 | 7/2008 | Condorelli et al. | |
| 7,402,508 B2 | 7/2008 | Kaneko | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,459,785 B2 | 12/2008 | Daubenspeck et al. | |
| 7,470,996 B2 * | 12/2008 | Yoneyama et al. | 257/780 |
| 7,494,845 B2 | 2/2009 | Hwang et al. | |
| 7,495,179 B2 | 2/2009 | Kubota et al. | |
| 7,528,494 B2 | 5/2009 | Furukawa et al. | |
| 7,531,890 B2 | 5/2009 | Kim | |
| 7,554,201 B2 | 6/2009 | Kang et al. | |
| 7,557,597 B2 | 7/2009 | Anderson et al. | |
| 7,569,935 B1 | 8/2009 | Fan | |
| 7,576,435 B2 | 8/2009 | Chao | |
| 7,659,631 B2 | 2/2010 | Kamins et al. | |
| 7,714,235 B1 | 5/2010 | Pedersen et al. | |
| 7,804,177 B2 | 9/2010 | Lu et al. | |
| 7,834,450 B2 | 11/2010 | Kang | |
| 7,939,939 B1 | 5/2011 | Zeng et al. | |
| 7,946,331 B2 | 5/2011 | Trezza et al. | |
| 8,026,128 B2 | 9/2011 | Pendse | |
| 8,076,232 B2 | 12/2011 | Pendse | |
| 8,093,729 B2 | 1/2012 | Trezza | |
| 8,120,175 B2 | 2/2012 | Farooq et al. | |
| 8,130,475 B2 | 3/2012 | Kawamori et al. | |
| 8,158,489 B2 | 4/2012 | Huang et al. | |
| 8,207,604 B2 | 6/2012 | Haba et al. | |
| 8,232,640 B2 | 7/2012 | Tomoda et al. | |
| 8,258,055 B2 | 9/2012 | Hwang et al. | |
| 8,313,213 B2 | 11/2012 | Lin et al. | |
| 8,367,939 B2 | 2/2013 | Ishido | |
| 8,435,881 B2 | 5/2013 | Choi et al. | |
| 8,576,368 B2 | 11/2013 | Kim et al. | |
| 8,823,166 B2 | 9/2014 | Lin et al. | |
| 9,355,980 B2 | 5/2016 | Chen et al. | |
| 9,583,687 B2 | 2/2017 | Hwang | |
| 2001/0013423 A1 | 8/2001 | Dalal et al. | |
| 2001/0038147 A1 | 11/2001 | Higashi et al. | |
| 2002/0033412 A1 | 3/2002 | Tung | |
| 2002/0084528 A1 | 7/2002 | Kim et al. | |
| 2002/0100974 A1 | 8/2002 | Uchiyama | |
| 2002/0106832 A1 | 8/2002 | Hotchkiss et al. | |
| 2002/0197811 A1 | 12/2002 | Sato | |
| 2003/0049886 A1 | 3/2003 | Salmon | |
| 2003/0092219 A1 | 5/2003 | Ohuchi et al. | |
| 2003/0094963 A1 * | 5/2003 | Fang | G01R 31/2884 324/756.05 |
| 2003/0166331 A1 | 9/2003 | Tong et al. | |
| 2003/0216025 A1 | 11/2003 | Lu et al. | |
| 2003/0218250 A1 | 11/2003 | Kung et al. | |
| 2004/0004284 A1 | 1/2004 | Lee et al. | |
| 2004/0007779 A1 | 1/2004 | Arbuthnot et al. | |
| 2004/0140538 A1 | 7/2004 | Harvey | |
| 2004/0159944 A1 | 8/2004 | Datta et al. | |
| 2004/0166661 A1 | 8/2004 | Lei | |
| 2004/0212098 A1 | 10/2004 | Pendse | |
| 2004/0251546 A1 | 12/2004 | Lee et al. | |
| 2005/0017376 A1 | 1/2005 | Tsai | |
| 2005/0062153 A1 | 3/2005 | Saito et al. | |
| 2005/0158900 A1 | 7/2005 | Lee et al. | |
| 2005/0212114 A1 | 9/2005 | Kawano et al. | |
| 2005/0224991 A1 | 10/2005 | Yeo | |
| 2005/0253264 A1 * | 11/2005 | Aiba et al. | 257/738 |
| 2005/0277283 A1 * | 12/2005 | Lin | H01L 23/53238 438/618 |
| 2006/0012024 A1 | 1/2006 | Lin et al. | |
| 2006/0017160 A1 | 1/2006 | Huang | |
| 2006/0038303 A1 | 2/2006 | Sterrett et al. | |
| 2006/0051954 A1 * | 3/2006 | Lin et al. | 438/614 |
| 2006/0055032 A1 | 3/2006 | Chang et al. | |
| 2006/0076677 A1 | 4/2006 | Daubenspeck et al. | |
| 2006/0209245 A1 | 9/2006 | Mun et al. | |
| 2006/0223313 A1 * | 10/2006 | Yoon | H01L 24/11 438/687 |
| 2006/0279881 A1 | 12/2006 | Sato | |
| 2006/0292824 A1 | 12/2006 | Beyne et al. | |
| 2007/0001280 A1 | 1/2007 | Hua | |
| 2007/0012337 A1 | 1/2007 | Hillman et al. | |
| 2007/0018294 A1 | 1/2007 | Sutardja | |
| 2007/0020906 A1 | 1/2007 | Chiu et al. | |
| 2007/0023483 A1 | 2/2007 | Yoneyama et al. | |
| 2007/0045840 A1 | 3/2007 | Varnau | |
| 2007/0057022 A1 | 5/2007 | Mogami et al. | |
| 2007/0114663 A1 | 5/2007 | Brown et al. | |
| 2007/0200234 A1 | 8/2007 | Gerber et al. | |
| 2008/0003402 A1 * | 1/2008 | Haba et al. | 428/119 |
| 2008/0003715 A1 | 1/2008 | Lee et al. | |
| 2008/0023850 A1 | 1/2008 | Lu et al. | |
| 2008/0087998 A1 | 4/2008 | Kamins et al. | |
| 2008/0128911 A1 | 6/2008 | Koyama | |
| 2008/0150135 A1 | 6/2008 | Oyama et al. | |
| 2008/0169544 A1 | 7/2008 | Tanaka et al. | |
| 2008/0180376 A1 | 7/2008 | Kim et al. | |
| 2008/0194095 A1 | 8/2008 | Daubenspeck et al. | |
| 2008/0217047 A1 | 9/2008 | Hu | |
| 2008/0218061 A1 | 9/2008 | Chao et al. | |
| 2008/0277785 A1 | 11/2008 | Hwan et al. | |
| 2009/0025215 A1 | 1/2009 | Murakami et al. | |
| 2009/0042144 A1 | 2/2009 | Kitada et al. | |
| 2009/0045499 A1 | 2/2009 | Kim et al. | |
| 2009/0075469 A1 | 3/2009 | Furman et al. | |
| 2009/0087143 A1 | 4/2009 | Jeon et al. | |
| 2009/0096092 A1 * | 4/2009 | Patel | 257/737 |
| 2009/0108443 A1 | 4/2009 | Jiang | |
| 2009/0146316 A1 | 6/2009 | Jadhav et al. | |
| 2009/0149016 A1 | 6/2009 | Park et al. | |
| 2009/0166861 A1 | 7/2009 | Lehr et al. | |
| 2009/0174067 A1 | 7/2009 | Lin | |
| 2009/0218702 A1 | 9/2009 | Beyne et al. | |
| 2009/0233436 A1 | 9/2009 | Kim et al. | |
| 2009/0250814 A1 | 10/2009 | Pendse et al. | |
| 2010/0007019 A1 | 1/2010 | Pendse | |
| 2010/0044860 A1 | 2/2010 | Haba et al. | |
| 2010/0052473 A1 | 3/2010 | Kimura et al. | |
| 2010/0084763 A1 | 4/2010 | Yu | |
| 2010/0141880 A1 | 6/2010 | Koito et al. | |
| 2010/0193944 A1 | 8/2010 | Castro et al. | |
| 2010/0200279 A1 | 8/2010 | Kariya et al. | |
| 2010/0252926 A1 | 10/2010 | Kato et al. | |
| 2010/0258950 A1 | 10/2010 | Li et al. | |
| 2010/0270458 A1 | 10/2010 | Lake et al. | |
| 2010/0276787 A1 | 11/2010 | Yu et al. | |
| 2010/0314745 A1 | 12/2010 | Masumoto et al. | |
| 2010/0327422 A1 | 12/2010 | Lee et al. | |
| 2011/0001250 A1 | 1/2011 | Lin et al. | |
| 2011/0024902 A1 * | 2/2011 | Lin | H01L 23/49816 257/737 |
| 2011/0038147 A1 | 2/2011 | Lin et al. | |
| 2011/0074022 A1 | 3/2011 | Pendse | |
| 2011/0084386 A1 | 4/2011 | Pendse | |
| 2011/0101519 A1 * | 5/2011 | Hsiao | H01L 23/49827 257/737 |
| 2011/0101526 A1 | 5/2011 | Hsiao et al. | |
| 2011/0169158 A1 | 7/2011 | Varanasi | |

(56) References Cited

U.S. PATENT DOCUMENTS

| | | |
|---|---|---|
| 2011/0177686 A1 | 7/2011 | Zeng et al. |
| 2011/0186986 A1 | 8/2011 | Chuang et al. |
| 2011/0193220 A1 | 8/2011 | Kuo et al. |
| 2011/0227219 A1* | 9/2011 | Alvarado ............... H01L 24/03 257/738 |
| 2011/0244675 A1 | 10/2011 | Huang et al. |
| 2011/0248399 A1 | 10/2011 | Pendse |
| 2011/0260317 A1 | 10/2011 | Lu et al. |
| 2011/0285011 A1 | 11/2011 | Hwang et al. |
| 2011/0285023 A1 | 11/2011 | Shen et al. |
| 2012/0007230 A1* | 1/2012 | Hwang et al. ............ 257/737 |
| 2012/0007231 A1 | 1/2012 | Chang |
| 2012/0012997 A1* | 1/2012 | Shen et al. ............... 257/737 |
| 2012/0040524 A1 | 2/2012 | Kuo et al. |
| 2012/0049346 A1* | 3/2012 | Lin ........................ H01L 24/11 257/737 |
| 2012/0091577 A1 | 4/2012 | Hwang et al. |
| 2012/0098120 A1 | 4/2012 | Yu et al. |
| 2012/0098124 A1 | 4/2012 | Wu et al. |
| 2012/0146168 A1 | 6/2012 | Hsieh et al. |
| 2012/0223428 A1 | 9/2012 | Pendse |
| 2012/0306080 A1 | 12/2012 | Yu et al. |
| 2013/0026622 A1 | 1/2013 | Chuang et al. |
| 2013/0026629 A1 | 1/2013 | Nakano |
| 2013/0087920 A1 | 4/2013 | Jeng et al. |
| 2013/0093079 A1 | 4/2013 | Tu et al. |
| 2013/0181340 A1* | 7/2013 | Uehling ................. H01L 24/11 257/737 |
| 2013/0252418 A1* | 9/2013 | Arvin .................. H01L 21/7685 438/643 |
| 2013/0270699 A1 | 10/2013 | Kuo et al. |
| 2013/0277830 A1 | 10/2013 | Yu et al. |
| 2013/0288473 A1 | 10/2013 | Chuang et al. |
| 2013/0341785 A1 | 12/2013 | Fu et al. |
| 2014/0048929 A1 | 2/2014 | Cha et al. |
| 2014/0054764 A1 | 2/2014 | Lu et al. |
| 2014/0054769 A1 | 2/2014 | Yoshida et al. |
| 2014/0054770 A1 | 2/2014 | Yoshida et al. |
| 2014/0061897 A1 | 3/2014 | Lin et al. |
| 2014/0061924 A1 | 3/2014 | Chen et al. |
| 2014/0077358 A1 | 3/2014 | Chen et al. |
| 2014/0077359 A1 | 3/2014 | Tsai et al. |
| 2014/0077360 A1 | 3/2014 | Lin et al. |
| 2014/0077365 A1 | 3/2014 | Lin et al. |
| 2014/0117533 A1 | 5/2014 | Lei et al. |
| 2014/0264890 A1 | 9/2014 | Breuer et al. |
| 2014/0346669 A1 | 11/2014 | Wang et al. |
| 2015/0091160 A1 | 4/2015 | Reber |
| 2015/0325542 A1 | 11/2015 | Lin et al. |
| 2016/0190090 A1 | 6/2016 | Yu |
| 2016/0254240 A1 | 9/2016 | Chen |
| 2016/0329293 A1 | 11/2016 | Cha et al. |

FOREIGN PATENT DOCUMENTS

| | | |
|---|---|---|
| CN | 102254871 A | 11/2011 |
| CN | 102386158 A | 3/2012 |
| CN | 102468197 | 5/2012 |
| EP | 1387402 A2 | 2/2004 |
| KR | 1020110002816 | 1/2011 |
| KR | 1020110128532 A | 11/2011 |
| TW | 200826265 A | 6/2008 |
| TW | 200915452 A | 4/2009 |
| TW | 201133662 | 10/2011 |
| TW | 201143007 | 12/2011 |
| WO | 2009140238 | 11/2009 |

* cited by examiner

STRUCTURES HAVING A TAPERING CURVED PROFILE AND METHODS OF MAKING SAME

CROSS-REFERENCE TO RELATED APPLICATIONS

This application claims the benefit of U.S. Provisional Application No. 61/702,624, filed on Sep. 18, 2012, entitled "Ladd Bump Structures and Methods of Making the Same," of U.S. Provisional Application No. 61/707,644, filed on Sep. 28, 2012, entitled "Metal Bump and Method of Manufacturing Same," of U.S. Provisional Application No. 61/707,609, filed on Sep. 28, 2012, entitled "Interconnection Structure Method of Forming Same," and of U.S. Provisional Application No. 61/707,442, filed on Sep. 28, 2012, entitled "Bump Structure and Method of Forming Same," which applications are hereby incorporated herein by reference.

BACKGROUND

In a typical copper (Cu) pillar bump process, solder with or without nickel (Ni) below always has a larger critical dimension (CD) than the bottom of the Cu pillar, due to Cu over etching. This large top and small bottom bump profile is critical for fine pitch assembly yield, especially in bump on trace (BOT) assembly. Because a top under bump metallurgy (UBM) is closer to a neighboring joint Cu trace, there is a higher risk that the solder portion will undesirably cause a bump to trace bridge.

In addition, a conventional bump process has an inversion tin (IT) layer along the Cu pillar sidewall. This inversion tin may undesirably increase the risk of delamination due to poor adhesion with a compound material (i.e., an underfill material).

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a ladder bump structure for a bump on trace (BOT) assembly. The concepts in the disclosure may also apply, however, to other semiconductor structures or circuits.

Figure 1:
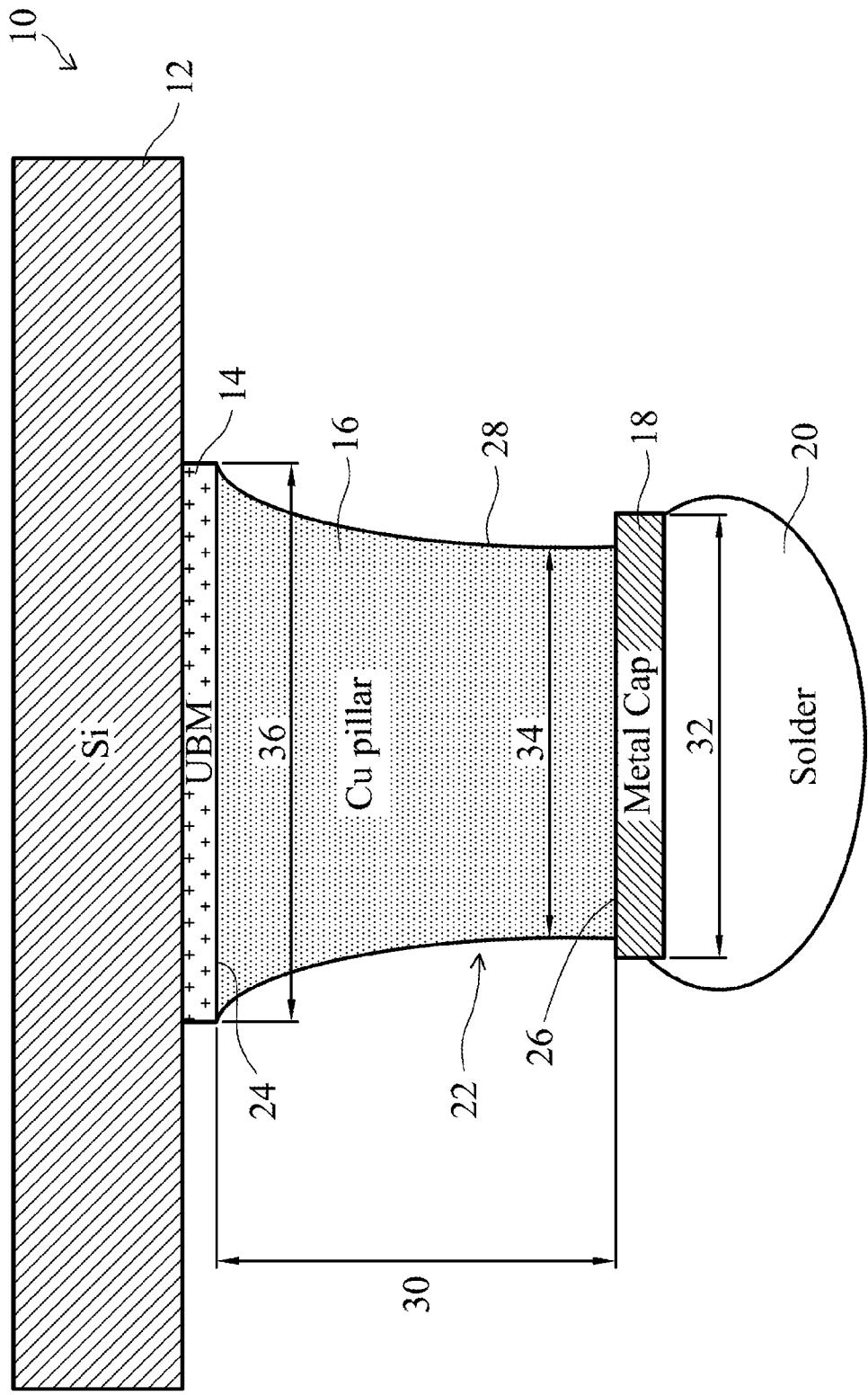
FIG. 1 is a cross sectional view of an embodiment ladder bump structure.

Referring now to FIG. 1, an embodiment ladder bump structure 10 is illustrated. As shown, the ladder bump structure 10 includes a substrate 12, an under bump metallurgy (UBM) feature 14, a copper pillar 16, a metal cap 18, and a solder feature 20. The substrate 12 may be, for example, a silicon wafer or silicon-containing layer of material. In some embodiments, an integrated circuit (not shown) is formed on and/or in the substrate 12, as is known in the art. Various layers and features of the substrate 12, including transistors, interconnect layers, dielectric layer, passivation layers, post passivation interconnects, redistribution layers, and the like are omitted from the figures for the sake of clarity, as they are not necessary to an understanding of the present disclosure.

Still referring to FIG. 1, the substrate 12 supports the UBM feature 14, which may be mounted on or in the substrate 12. As shown, the UBM feature 14 generally supports the copper pillar 16. The copper pillar 16 has a necking profile 22 (a.k.a., a curved tapered profile) that diminishes in width from a bottom 24 to a top 26 of the copper pillar 16 as shown in FIG. 1. In other words, the bottom 24 of the copper pillar 16 is wider than the top 26 of the copper pillar 16. As used herein, the "bottom" of the copper pillar 16 is the portion closest to the substrate 12 while the "top" of the copper pillar 16 is the portion furthest from the substrate 12. In an embodiment the copper pillar 16 has sidewalls 28 that are generally concave from the bottom 24 to the top 26 along an entire height 30 (i.e., or length) of the sidewalls 28 of the copper pillar 16.

Still referring to FIG. 1, the metal cap 18 is supported by or mounted on the copper pillar 16. In an embodiment, the metal cap 18 is formed from nickel (Ni). Even so, other metals may be suitably used for the metal cap 18. As shown, the metal cap 18 generally overhangs the copper pillar 16 where the metal cap 18 and the copper pillar 16 meet or abut. In other words, the metal cap 18 is wider than the copper pillar 16 where the copper pillar 16 interfaces with the metal cap 18 proximate the top 26 of the copper pillar 16.

In an embodiment, the process of etching the UBM feature 14 creates or induces the metal cap 18 overhang and/or the necking profile 22 of the copper pillar 16. A ladder photoresist (PR) is sprayed on UBM film deposited on silicon (Si) wafer. A well controlled photolithography process is used to create a ladder bump profile, which has a smaller top and a larger bottom critical dimension (CD). After the ladder bump profile is created, a normal bump process follows, which includes plating copper and the metal cap within photoresist opening, removing surrounding photoresist, and etching exposed and undesired UBM film by chemical etching to achieve the so-called ladder bump existing on wafer. The metal cap 18 overhang provides a larger contact area and has a strong adhesion with, for example, a molded underfill (MUF) or underfill compound.

In an embodiment, a ratio of a width 34 of the copper pillar 16 where the copper pillar 16 abuts the metal cap 18 (i.e., at the top 26 of the copper pillar 16) to a width 32 of the metal cap 18 is between about 0.92 to about 1.0. In an embodiment, a ratio of a width 36 of the copper pillar 16 where the copper pillar 16 abuts the UBM feature 14 to the width 32 of the metal cap 18 is between about 1.05 to about 1.07.

Still referring to FIG. 1, the solder feature 20 is mounted on or over the metal cap 18. In an embodiment, the solder feature 20 may be a ball, a bump, or the like, that may be contacted to another electrical device and reflowed to electrically bond the two devices together.

Figure 2:
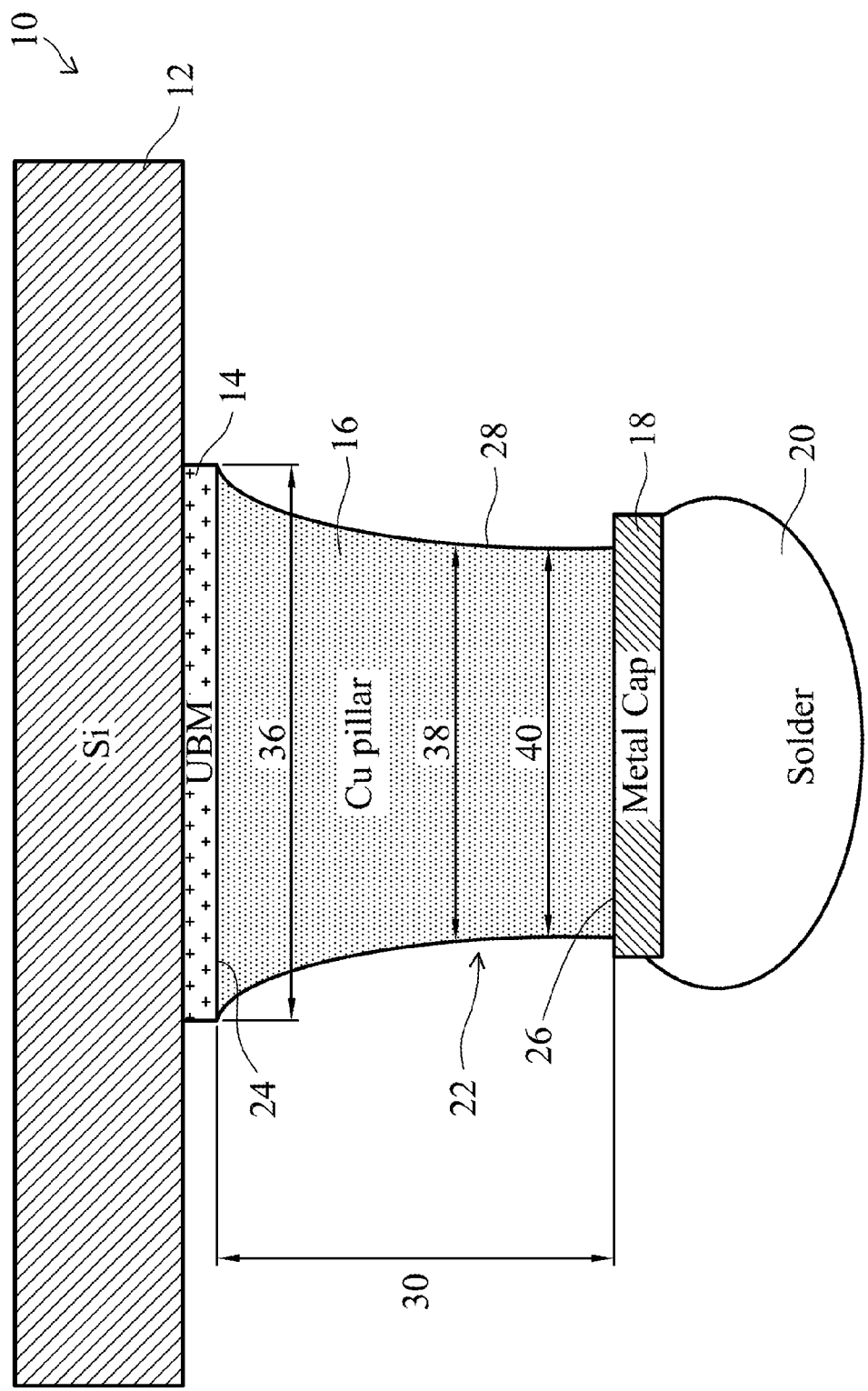
FIG. 2 is a cross sectional view of the embodiment ladder bump structure providing illustrative dimensions.

Referring now to FIG. 2, in an embodiment ladder bump structure 10 a ratio of a width 38 of the copper pillar 16 at half the height 30 (i.e., length) of the copper pillar 16 to the width 36 of the bottom 24 of the copper pillar 16 is between about 0.92 to about 0.94. In addition, in an embodiment a ratio of a width 40 of the copper pillar 16 at a quarter of the height 30 of the copper pillar 16 (measured from the top 26 of the copper pillar 16) to the width 36 of the bottom 24 of the copper pillar 16 is between about 0.9 to about 0.93.

Figure 3:
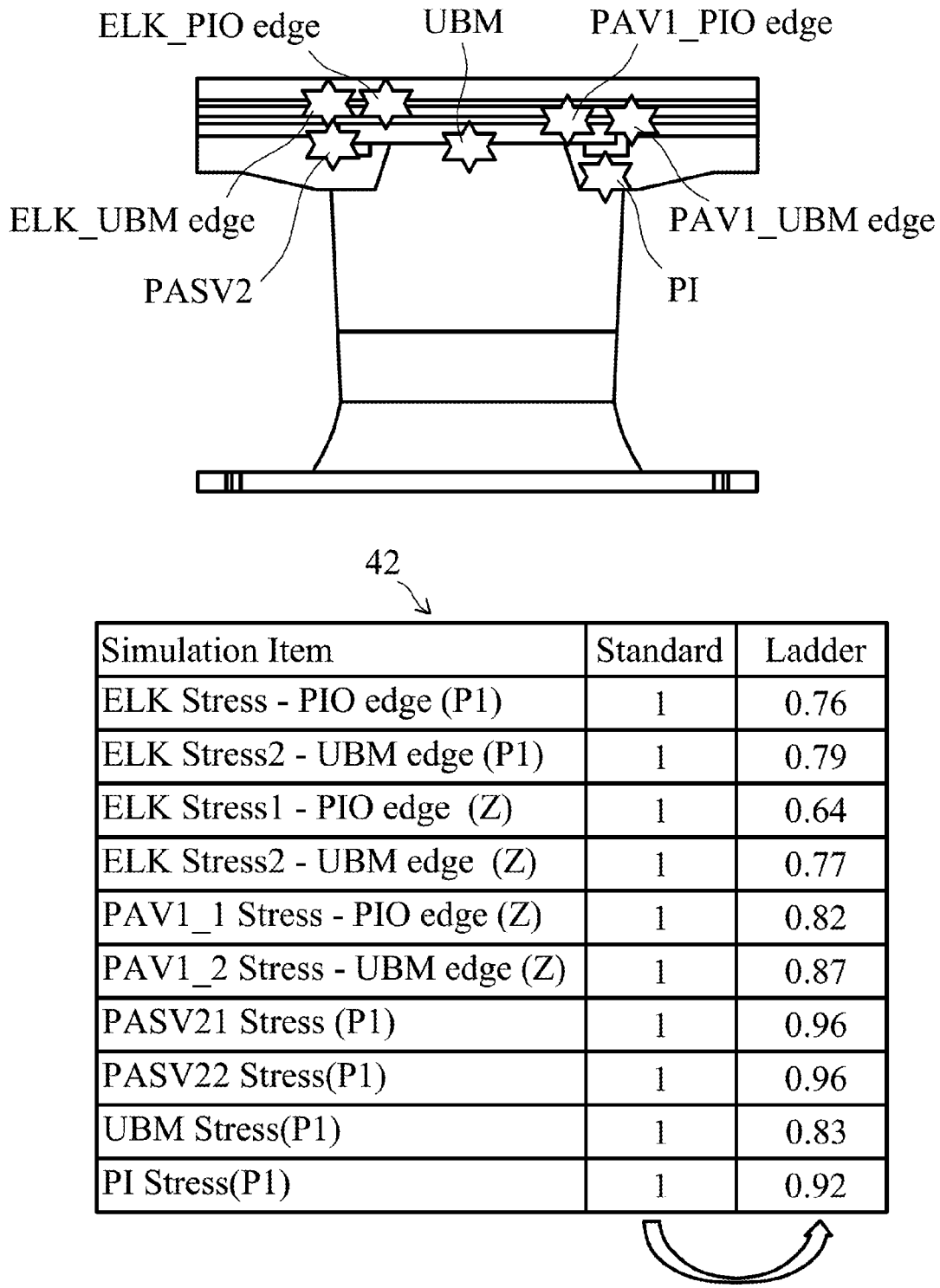
FIG. 3 is a table showing simulated stress results.

FIG. 3 provides the results 42 of simulation studies run to determine the likely improvement to stress performance, particularly, stress imparted on underlying and/or surrounding layers, such as ELK (Extra Low K dielectric layers), passivation layers, UBM layers, and polyimide layers, that typically form a part of a packaged integrated circuit structure. Note that the simulation results suggest the structure illustrated in FIGS. 1 and 2 will result in reduced stress in the underlying and/or surrounding layers and features.

Figure 4:
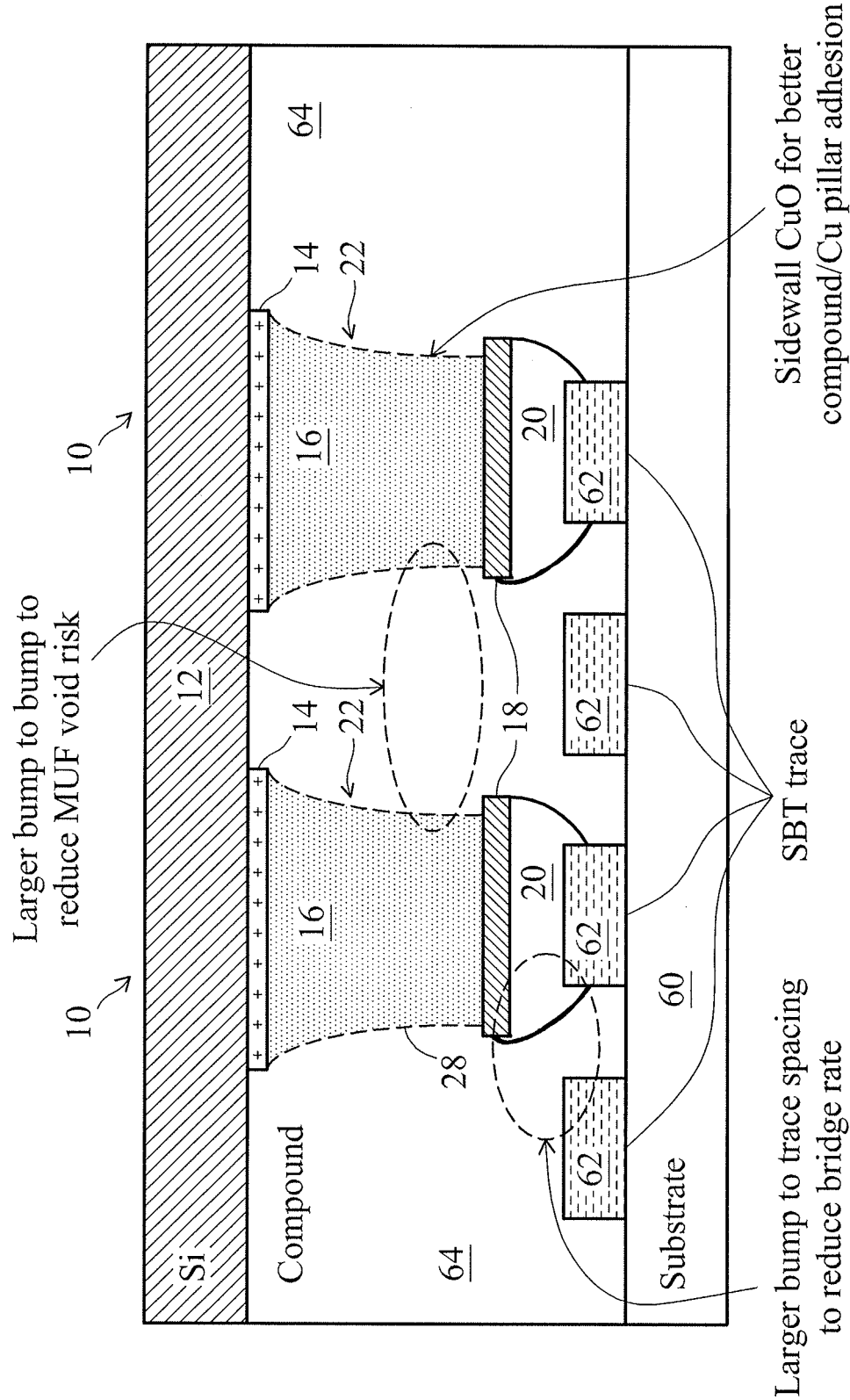
FIG. 4 illustrates the embodiment ladder bump structure of FIG. 1 forming a bump on trace (BOT) mechanical connection.

FIG. 4 illustrates two illustrative ladder bump structures 10 mounted to connect the substrate 12 (which may include one or more integrated circuit devices) onto an underlying substrate 60. In the illustrated embodiment, the substrate 60 is mounted using a bond on trace (BOT) approach. Fine pitch assembly can be achieved using the illustrative ladder bump structures 10. Assembly yield, including solder to substrate trace 62 bridge rate reduction and bump-to-bump molded underfill (MUF) 64 void risk, can be achieved. Further, the illustrative ladder bump process does not require an inversion Tin (IT) coating to be formed on the sidewalls 28 of the copper pillar 16. This reduces costs. Further, the absence of the IT coating allows for a copper oxide (CuO) film to form along sidewalls 28 of the copper pillar 16. This CuO film has higher adhesion with the molding compound 64 and/or under-fill than does IT, and also enhances resistance, such as resistance to humidity, as evidenced by performance in Highly Accelerated Stress Testing (HAST).

Figure 5:
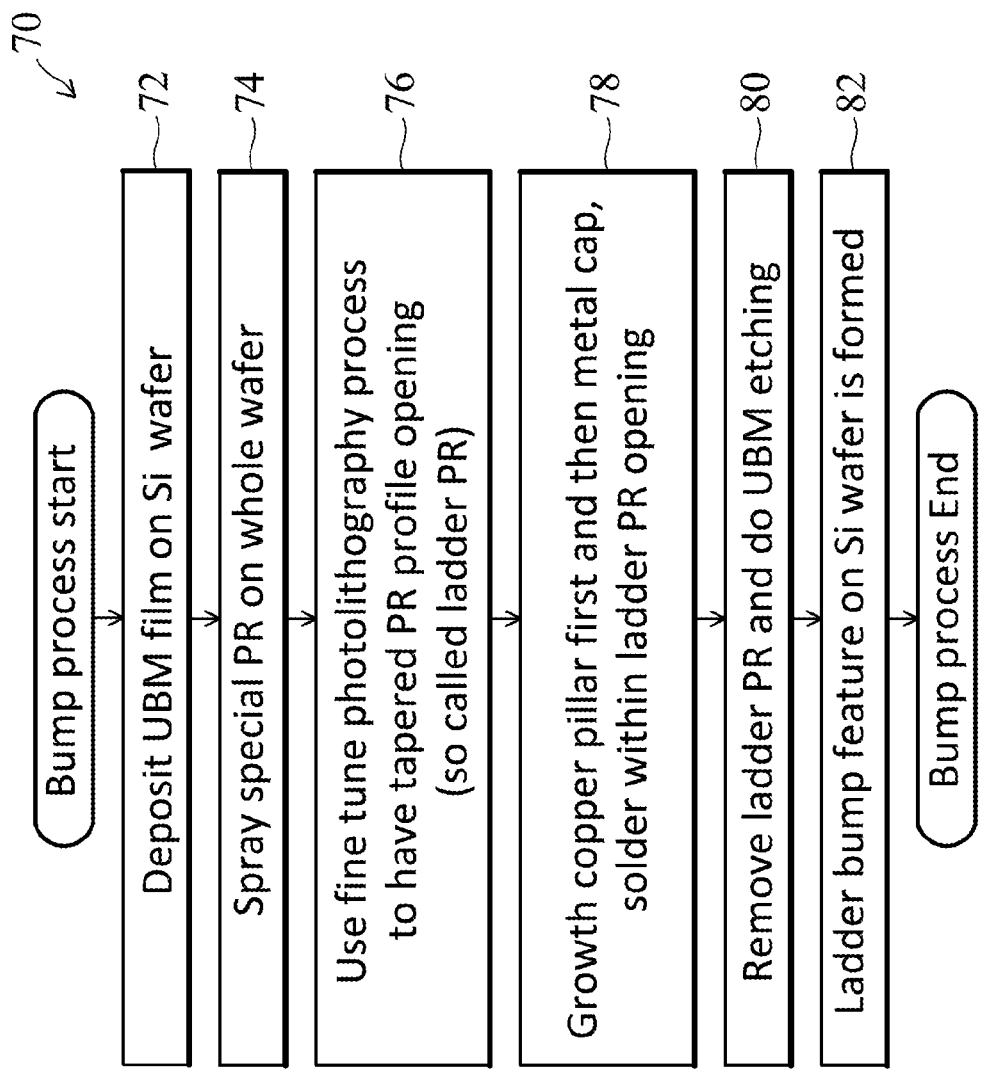
FIG. 5 is a flow diagram illustrating a method of forming the embodiment ladder structure of FIG. 1.

Referring now to FIG. 5, a method 70 of forming the embodiment ladder bump structure 10 of FIG. 1 is provided. In block 72, the UBM feature 14 is deposited on the Si substrate 12. In block 74, a special photoresist (PR) called ladder PR is sprayed on UBM film deposited Si wafer. In block 76, a well controlled photolithography process is used to create the ladder bump profile, which has a smaller top and larger bottom critical dimension (CD). Then, in block 78, the copper pillar 16 is grown within the ladder PR opening. Notably, the copper pillar 16 has a tapering curved profile (i.e., the necking profile). Then, the metal cap 18 and solder 20 are grown on the copper pillar 16. Then, in block 80, the surrounding PR is removed and etching exposed and undesired UBM film by chemical etching occurs. In block 82, the so-called ladder bump is formed on wafer 12. It should be recognized that additional or intervening steps may be added to or included in the method 70 in other embodiments.

From the foregoing it should be recognized that embodiment bump ladder structures 10 provide advantageous features. For example, the bump structure (i.e., ladder bump structure) is created for fine pitch bond on trace (BOT) assembly with a yield enhancement by avoiding a solder to substrate (SBT) trace bridge and/or a bump to bump molded underfill (MUF) void. In addition, the illustrative bump structure is composed by a Ni overhanging/Cu pillar necking profile with wider bottom dimension than top.

The innovative bump process described herein skips a conventional inversion Tin (IT) layer around the Cu pillar, and the bump surface has some CuO above the Cu sidewall, which provides a higher adhesion with molding compound or under-fill material.

Advantageous of some described embodiments may include that the Solder with Ni (or other metal) has a larger dimension than a top of the Cu pillar. An illustrative UBM etching process induces Ni overhang and Cu pillar necking. The Ni overhang provides larger contact area and has strong adhesion with a compound such as an under-fill or molding compound. The illustrative ladder bump feature has a wider bottom than top dimension of Ni and the Cu pillar necking profile may reduce extremely low-k dielectric (ELK), passivation, UBM and polyimide (PI) stress. Also, the illustrated embodiments provide a larger contact area for Cu pillar/compound adhesion enhancement. Another advantage may include that the Cu pillar has no conventional inversion Tin (IT) coating and instead uses copper oxide (CuO) on the sidewalls to enhance resistance in reliability testing.

The following references are related to subject matter of the present application. Each of these references is incorporated herein by reference in its entirety:

U.S. Publication No. 2011/0285023 of Shen, et al. filed on Nov. 24, 2011, entitled "Substrate Interconnections Having Different Sizes."

An embodiment ladder bump structure includes an under bump metallurgy (UBM) feature supported by a substrate, a copper pillar mounted on the UBM feature, the copper pillar having a tapering curved profile, a metal cap mounted on the copper pillar, and a solder feature mounted on the metal cap.

An embodiment ladder bump structure includes an under bump metallurgy (UBM) feature on a substrate, a copper pillar on the UBM feature, the copper pillar having a necking profile such that a first width of the copper pillar nearest the substrate is greater than a second width of the copper pillar further away from the substrate, a metal cap on the copper pillar, the metal cap having a cap width greater than a pillar width of the copper pillar at an interface between the metal cap and the copper pillar, and a solder feature on the metal cap.

An embodiment method of forming a ladder bump structure includes mounting an under bump metallurgy (UBM) feature on a Si substrate, mounting a copper pillar on the UBM feature, the copper pillar shaped to have a tapering curved profile, mounting a metal cap on the copper pillar, and mounting a solder feature on the metal cap.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a bump structure, comprising:
   forming an under bump metallurgy (UBM) feature on a first substrate;
   forming a mask layer, the mask layer having an opening, the opening exposing the UBM feature;

forming a copper pillar in the opening on the UBM feature, the copper pillar shaped to have a tapering curved profile;

forming a metal cap on the copper pillar;

forming a solder feature on the metal cap, wherein forming the solder feature comprises forming the solder feature on the metal cap such that a first sidewall of the metal cap is partially covered by the solder feature, and a second sidewall of the metal cap opposing the first sidewall is free of the solder feature;

after forming the solder feature, removing the mask layer;

after removing the mask layer, performing an etching process to remove portions of the UBM feature extending beyond the copper pillar, wherein after the etching process, a width of the metal cap is larger than an interface width of the copper pillar where the copper pillar abuts the metal cap;

forming a copper oxide along sidewalls of the copper pillar;

after forming the copper oxide, attaching the solder feature to a raised trace on a second substrate, the solder feature extending along sidewalls of the raised trace; and forming an underfill between the first substrate and the second substrate, the underfill directly contacting the copper oxide.

2. The method of claim 1, wherein a bottom of the copper pillar is wider than a top of the copper pillar.

3. The method of claim 1, wherein a first width of the copper pillar nearest the first substrate is greater than a second width of the copper pillar further away from the first substrate along an entire height of the sidewalls of the copper pillar.

4. The method of claim 1, wherein the metal cap is nickel.

5. The method of claim 1, wherein the mask layer comprises a photoresist material.

6. The method of claim 1, wherein the etching process is a single etching process.

7. The method of claim 1, wherein a ratio of a width of copper pillar where the copper pillar abuts the UBM feature to the width of the metal cap is between about 1.05 to about 1.07.

8. The method of claim 1, wherein the etching process removes at least portions of the copper pillar contacting the metal cap.

9. A method of forming a bump structure, comprising:

forming an under bump metallurgy (UBM) layer on a first substrate;

forming a mask layer, the mask layer having an opening exposing the UBM layer, the opening having a curved profile, the opening having a width that reduces as the opening extends away from the UBM layer;

forming a metal pillar in the opening;

forming a metal cap on the metal pillar;

forming a solder feature on the metal cap, wherein the solder feature extends along at least a portion of a first sidewall of the metal cap, and a second sidewall of the metal cap opposing the first sidewall is free of the solder feature;

after forming the solder feature, removing the mask layer;

after removing the mask layer, etching the UBM layer using an etching process to form a UBM feature, wherein after the etching process, a width of the metal cap is larger than an interface width of the metal pillar at an interface between the metal pillar and the metal cap, and the UBM feature does not extend laterally past the metal pillar;

forming a metal oxide along sidewalls of the metal pillar;

attaching the first substrate to a second substrate using a bump-on-trace connection, wherein the solder feature extends along sidewalls of a trace, the solder feature not extending along the sidewalls of the metal pillar; and forming an underfill between the first substrate and the second substrate, the underfill directly contacting the metal oxide.

10. The method of claim 9, wherein the metal pillar comprises copper.

11. The method of claim 10, wherein the metal oxide comprises copper oxide.

12. The method of claim 9, wherein the mask layer comprises a photoresist layer.

13. The method of claim 9, wherein a ratio of a width of the metal pillar at half a height of the metal pillar to a width of a bottom of the metal pillar is between about 0.92 to about 0.94.

14. The method of claim 9, wherein a ratio of a width of the metal pillar at a quarter of a height of the metal pillar measured from a top of the metal pillar to a width of a bottom of the metal pillar is between about 0.9 to about 0.93.

15. A method of forming a bump structure, comprising:

forming an under bump metallurgy (UBM) layer on a first substrate;

forming a photoresist layer;

patterning the photoresist layer to form a tapered opening, the UBM layer being exposed in the tapered opening, sidewalls of the tapered opening having a curved cross section;

forming a metal pillar in the tapered opening;

forming a metal cap in the tapered opening on the metal pillar;

forming a solder feature on the metal cap, the solder feature extending along a portion of a first sidewall of the metal cap, the solder feature not extending along a second sidewall of the metal cap opposing the first sidewall;

after forming the solder feature, removing the photoresist layer;

after removing the photoresist layer, etching the UBM layer to form a UBM feature, wherein after etching the UBM layer, a width of the metal cap is larger than an interface width of the metal pillar where the metal pillar adjoins the metal cap, and the UBM feature does not extend laterally past the metal pillar;

forming a metal oxide along sidewalls of the metal pillar;

reflowing the solder feature;

attaching the first substrate to a second substrate using a bump-on-trace connection, wherein the solder feature extends along sidewalls of a trace, the solder feature not extending along the sidewalls of the metal pillar; and forming an underfill between the first substrate and the second substrate, the underfill directly contacting the metal oxide.

16. The method of claim 15, wherein a width of the tapered opening increases as the tapered opening approaches the UBM layer.

17. The method of claim 15, wherein the sidewalls of the metal pillar are free of any tin coating.

18. The method of claim 15, wherein the metal pillar comprises a copper pillar and the metal cap comprises a nickel cap.

19. The method of claim 15, wherein a bottom of the metal pillar is wider than a top of the metal pillar.

20. The method of claim 15, wherein a ratio of the interface width of the metal pillar where the metal pillar adjoins the metal cap to the width of the metal cap is between about 0.92 to about 1.0.

* * * * *